United States Patent
Iwata et al.

(10) Patent No.: US 7,681,520 B2
(45) Date of Patent: Mar. 23, 2010

(54) FUNCTIONAL DROPLET COATING APPARATUS, DISPLAY, AND ELECTRONIC DEVICE

(75) Inventors: Yuji Iwata, Suwa (JP); Manabu Nagasaka, Chino (JP)

(73) Assignee: Seiko Epson Corporation (JP)

( * ) Notice: Subject to any disclaimer, the term of this patent is extended or adjusted under 35 U.S.C. 154(b) by 682 days.

(21) Appl. No.: 11/424,964

(22) Filed: Jun. 19, 2006

(65) Prior Publication Data
US 2006/0283385 A1 Dec. 21, 2006

(30) Foreign Application Priority Data
Jun. 20, 2005 (JP) ............... 2005-178965

(51) Int. Cl.
*B05C 11/00* (2006.01)
*B05B 13/02* (2006.01)

(52) U.S. Cl. ............... 118/58; 118/64; 118/305; 118/665; 118/698

(58) Field of Classification Search ........... 118/305, 118/58, 300, 64, 50, 663, 665, 679, 682, 118/696–699; 101/424.1; 347/102, 104; 34/633, 635
See application file for complete search history.

(56) References Cited

U.S. PATENT DOCUMENTS

| | | | |
|---|---|---|---|
| 5,757,407 A | * | 5/1998 | Rezanka .................. 347/102 |
| 6,397,488 B1 | * | 6/2002 | Brinkly ........................ 34/92 |
| 6,505,928 B1 | * | 1/2003 | Landau et al. .............. 347/102 |
| 7,364,622 B2 | | 4/2008 | Hasei et al. |
| 2001/0041311 A1 | | 11/2001 | Araki et al. |

FOREIGN PATENT DOCUMENTS

| | | |
|---|---|---|
| CN | 1444424 A | 9/2003 |
| JP | 03-249623 | 11/1991 |
| JP | 10-197873 | 7/1998 |
| JP | 2002-239441 | 8/2002 |
| JP | 2003-112098 | 4/2003 |
| JP | 2003-142260 | 5/2003 |
| JP | 2003-225600 | 8/2003 |
| JP | 2004-111278 | 4/2004 |
| JP | 2004-219038 | 8/2004 |
| JP | 2004-253179 | 9/2004 |
| JP | 2005-085814 | 3/2005 |

* cited by examiner

*Primary Examiner*—Yewebdar T Tadesse
(74) *Attorney, Agent, or Firm*—Harness, Dickey & Pierce, P.L.C.

(57) ABSTRACT

A functional droplet coating apparatus includes a functional droplet discharge head for discharging a functional droplet, a stage for setting thereon a board to be coated with the functional droplet discharged from the functional droplet discharge head, and a drying unit for covering one or entire part of the board set on the stage, the drying unit for drying the functional droplet ejected from the functional droplet discharge head.

3 Claims, 4 Drawing Sheets

FUNCTIONAL DROPLET COATING APPARATUS, DISPLAY, AND ELECTRONIC DEVICE

BACKGROUND OF THE INVENTION

1. Technical Field

The present invention relates to a functional droplet coating apparatus applying an ink-jet method, a display manufactured using the coating apparatus, and an electronic device manufactured using a display.

2. Related Art

Generally, such a method that oriented films of liquid crystal panels are formed by the ink-jet method is known as a method for coating the functional droplets by the ink-jet method, as disclosed in a first example mentioned below. Furthermore, such a method characterized in making the oriented films is also known, that two or more kinds of raw materials for the oriented film are blown out of a discharge opening and that the oriented films are formed in a mosaic form, as disclosed in a second example mentioned below.

JP-A-3-249623 is the first example of related art and JP-A-10-197873 is the second example of related art.

However, in the case of ejection of the functional droplet from a functional droplet discharge head onto a board or the like by the ink-jet method, the functional droplet ejected onto the board gradually starts drying up at room temperature. This drying time changes depending on a lapse time after ejection of functional droplet onto the single board is started.

For example, the functional droplet presently ejected from the functional droplet discharge head shows the substantially same liquid characteristic as the functional droplet contained in the functional droplet coating apparatus, which is to be ejected from now.

However, where the functional droplet was ejected from the functional droplet discharge head onto the board one hour before at the start, for example, this functional droplet ejected at the start is in the substantially same state as that of functional droplet left at the room temperature for one hour.

The functional droplet in the aforementioned state has a thin center portion in an ejected shape while having a thick portion near an edge thereof, in inverse proportion to a thickness of the center portion. This phenomenon is referred to as a "blotching" hereinafter.

Upon occurrence of this "blotching", uniformity is lost from a film of the functional droplet ejected onto the board, so that the a color filter has difficult keeping a desired color property in the case where the color filter is composed of the film of the functional droplet. Furthermore, where the "blotching" occurs on the film of the functional drop such as a fluorescent material of an EL (Electro Luminescence), each display element of an organic EL element of an ELD (Electro Luminescence Display), or a conducting wiring or an oriented film of an LCD (Liquid Crystal Display), a required function of each element may be impaired.

SUMMARY

An advantage according to some aspects of the invention is to prevent a "blotching" of a functional droplet on a board and to prevent damage on the board by promptly performing a coating process through a drying process with the board set on the same stage and by repeating the coating process and the drying process more than one time as necessary, in which the coating process is to eject the functional droplet onto the board and the drying process is to dry the functional droplet ejected onto the board.

To solve the aforementioned problems, a functional droplet coating apparatus according to an aspect of the invention includes a functional droplet discharge head for discharging a functional droplet, a stage for setting thereon a board to be coated with the functional droplet discharged from the functional droplet discharge head, and a drying unit for covering one or entire part of the board set on the stage, the drying unit for drying the functional droplet ejected from the functional droplet discharge head.

With the aforementioned functional droplet coating apparatus, the functional droplet is ejected from the functional droplet discharge head to coat the board set on the stage, and the drying unit covers the one or entire part of the board set on the stage, thereby being able to dry the functional droplet ejected from the functional droplet discharge head onto the board. A "blotching" of the functional droplet on the board can be prevented while damages on the board can be prevented by shifting the stage with the board set thereon in a coating process for ejecting the functional droplet onto the board though a drying process for drying the functional droplet ejected onto the board.

It is preferable that the drying unit include a decompression drying function.

In this manner, the drying unit of the functional droplet coating apparatus according to an aspect of the invention includes the decompression drying function, thereby being able to dry a solvent of the functional droplet ejected in a liquid state for coating the board. The functional droplet can be dried at comparatively low temperature in a comparatively short time by compressing an interior of the drying unit, so that the "blotching" of the functional droplet on the board can be prevented.

It is preferable that the functional droplet coating apparatus repeat more than one time at least the coating process for ejecting the functional droplet from the functional droplet discharge head to coat the board set on the stage with the functional droplet and the drying process for covering the one or entire part of the board set on the stage to dry the functional droplet ejected from the functional droplet discharge head onto the board.

In this manner, the functional droplet coating apparatus according to an aspect of the invention repeats more than one time at least the coating process for ejecting the functional droplet from the functional droplet discharge head to coat the board set on the stage with the functional droplet and the drying process for covering the one or entire part of the board set on the stage to dry the functional droplet ejected from the functional droplet discharge head onto the board, so that the "blotching" of the functional droplet on the board can be prevented while the board can be prevented from getting damaged since the coating process and the drying process are repeated in a state such that the board is set on the stage.

It is preferable that the drying unit and the stage form a decompression chamber in the drying process.

In this manner, in the functional droplet coating apparatus according to an aspect of the invention, the drying unit and the stage form a decompression chamber in the drying process, so that airtightness in the decompression chamber can be maintained, thereby resulting in the desired decompression. Therefore, the functional droplet which coats the board set on the stage can be dried in a short time, so that the "blotching" of the functional droplet on the board can be prevented.

It is preferable that the drying unit and the board form the decompression chamber in the drying process.

In this manner, in the functional droplet coating apparatus according to an aspect of the invention, the drying unit and the board form the decompression chamber in the drying process, so that in the case of the functional droplet of large size, the functional droplet on the board can be dried since the decompression chamber is formed in the drying process by covering such a portion of the functional droplet on the boards as requiring to be dried. Thus, the "blotching" of the functional droplet on the stage can be prevented.

A display according to another aspect of the invention is manufactured using the functional droplet coating apparatus according to an aspect of the invention.

In this manner, the display according to another aspect of the invention is manufactured using the functional droplet coating apparatus according to an aspect of the invention, so that the "blotching" of the functional droplet on the board can be prevented while damages on the board can be prevented, thereby being able to provide the display of high quality and high yield.

An electronic device according to a further aspect of the invention includes the display according to another aspect of the invention.

In this manner, the electronic device according to a further aspect of the invention includes the display according to another aspect of the invention, so that the electronic device of high quality can be provided at a low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to drawings.

First Embodiment

Figure 1:
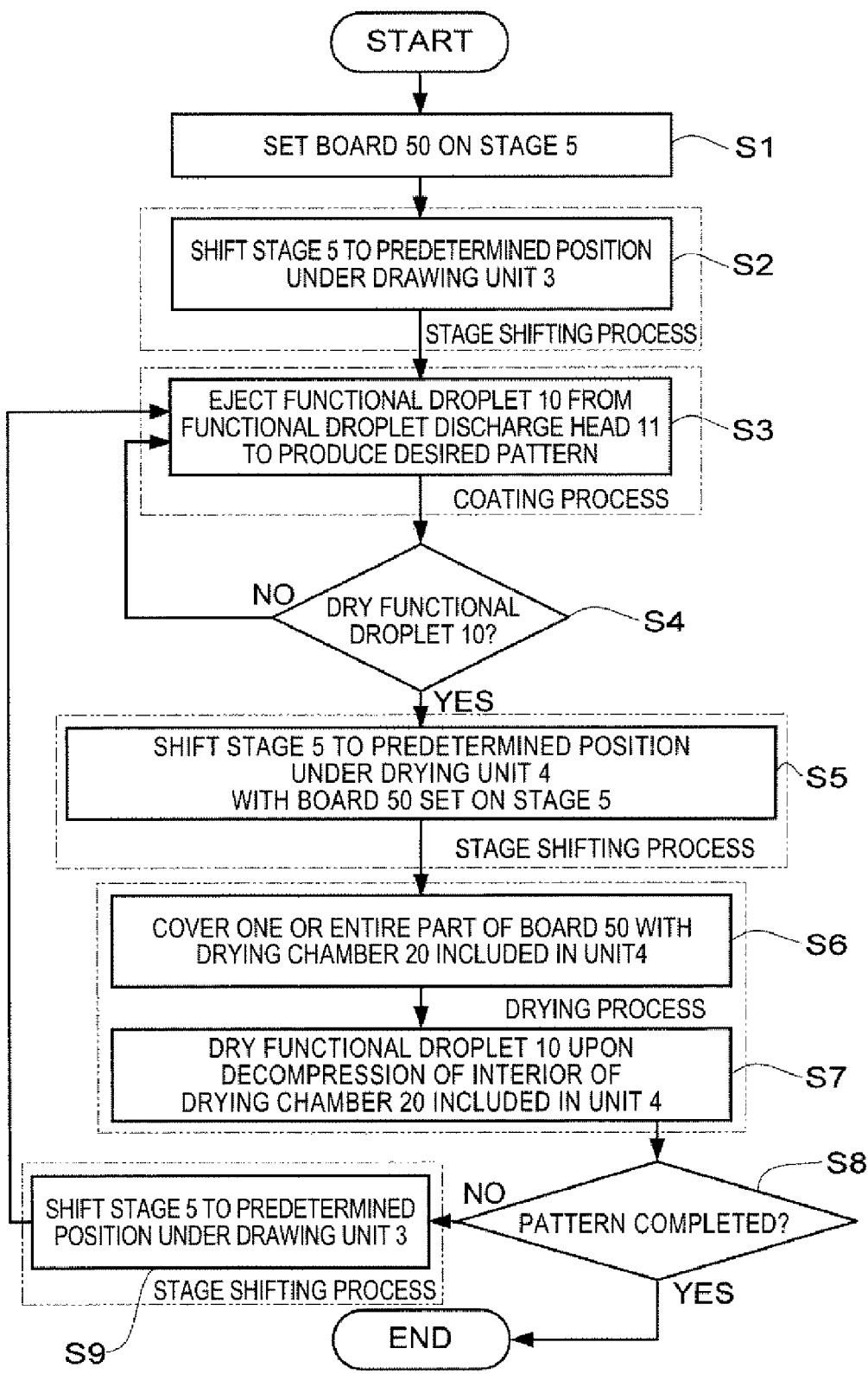
FIG. 1 is a flow chart showing a relation between a coating process for ejecting a functional droplet in a functional droplet coating apparatus to coat a board with the functional droplet according to an embodiment of the invention, a stage shifting process for shifting the stage on which the board is set, and a drying process for drying the functional droplet.

FIG. 1 is a flow chart showing a relation between a coating process for ejecting a functional droplet in a functional droplet coating apparatus to coat a board with the functional droplet according to an embodiment of the invention, a stage shifting process for shifting the stage on which the board is set, and a drying process for drying the functional droplet. It is to be noted that reference numbers of members described in FIG. 1 are corresponding to those of members described in FIGS. 2, 3, and 4.

A board 50 is set on a stage 5 at the step 1. The stage 5 is shifted to a predetermined position under a drawing unit 3 at the step S2 as a stage shifting process. Functional droplet 10 is ejected from a functional drop discharge head 11 to produce a desired pattern at the step S3 as a coating process. Materials or the like of the functional droplet 10 will be described later. There are such functional droplet discharge heads 11 as employing an ink-jet method, a dispenser method, and a dripping method, respectively.

A judgment is made at the step S4 as to whether the functional droplet 10 is to be dried or not. In the case of reaching with a certain lead time, a time as a blotching prevention time shorter than a time as a blotching occurrence time during which the aforementioned "blotching" phenomenon occurs upon ejection of the functional droplets 10 onto the board 50, dry of the functional droplet 10 is judged as necessary, thereby canceling ejection of the functional droplet 10 from the functional droplet discharge head 11, and thus the operation goes to the step S5. In the case where an ejection lapse time after start of ejection of the functional droplet 10 onto the board 50 is within the blotching prevention time, the "blotching" phenomenon does not occur, thereby not requiring dry of the functional droplets 10. Ejection of the functional droplet 10 at the step 3 is continued.

At the step 5 as the stage shifting process, the stage 5 is shifted to the predetermined position under the drying unit 4 in a state such that the board 50 is set on the stage 5. At the step S6 as the drying process, the board 50 is partially or entirely covered with a drying chamber 20 serving as a decompression chamber included in the drying unit 4. At the step S7 as the drying process, the functional droplet 10 is dried by decompressing an interior of the drying chamber 20 included in the drying unit 4.

A judgment is made at the step S8 as to whether the pattern is completed or not. In the case of incompletion of the pattern, the stage 5 is shifted to the predetermined position under the drawing unit 3 at the step S9 as the stage shifting process. The operation returns to the step S3 to produce the pattern on the board 50 by ejecting the functional droplet 10 from the functional droplet discharge head 11. This procedural step is executed by repeating the aforementioned steps more than one time at least until when the pattern is completed. Furthermore, in the case of completion of the pattern, the board 50 is removed from the stage 5 to terminate this operation.

Figure 2:
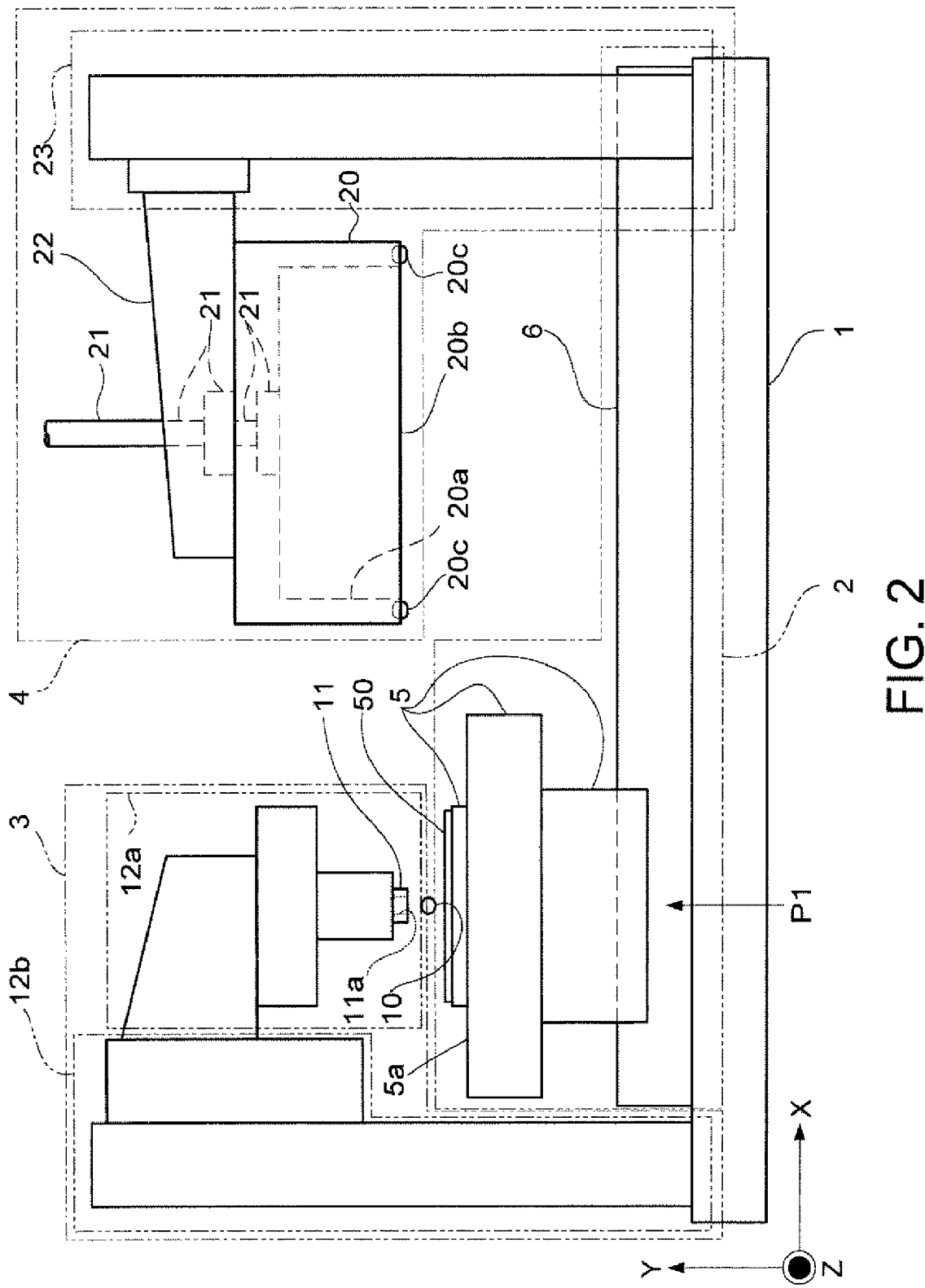
FIG. 2 is a schematic view showing such a state that the functional droplet is ejected onto the board using the functional droplet coating apparatus according to the invention.
Figure 3:
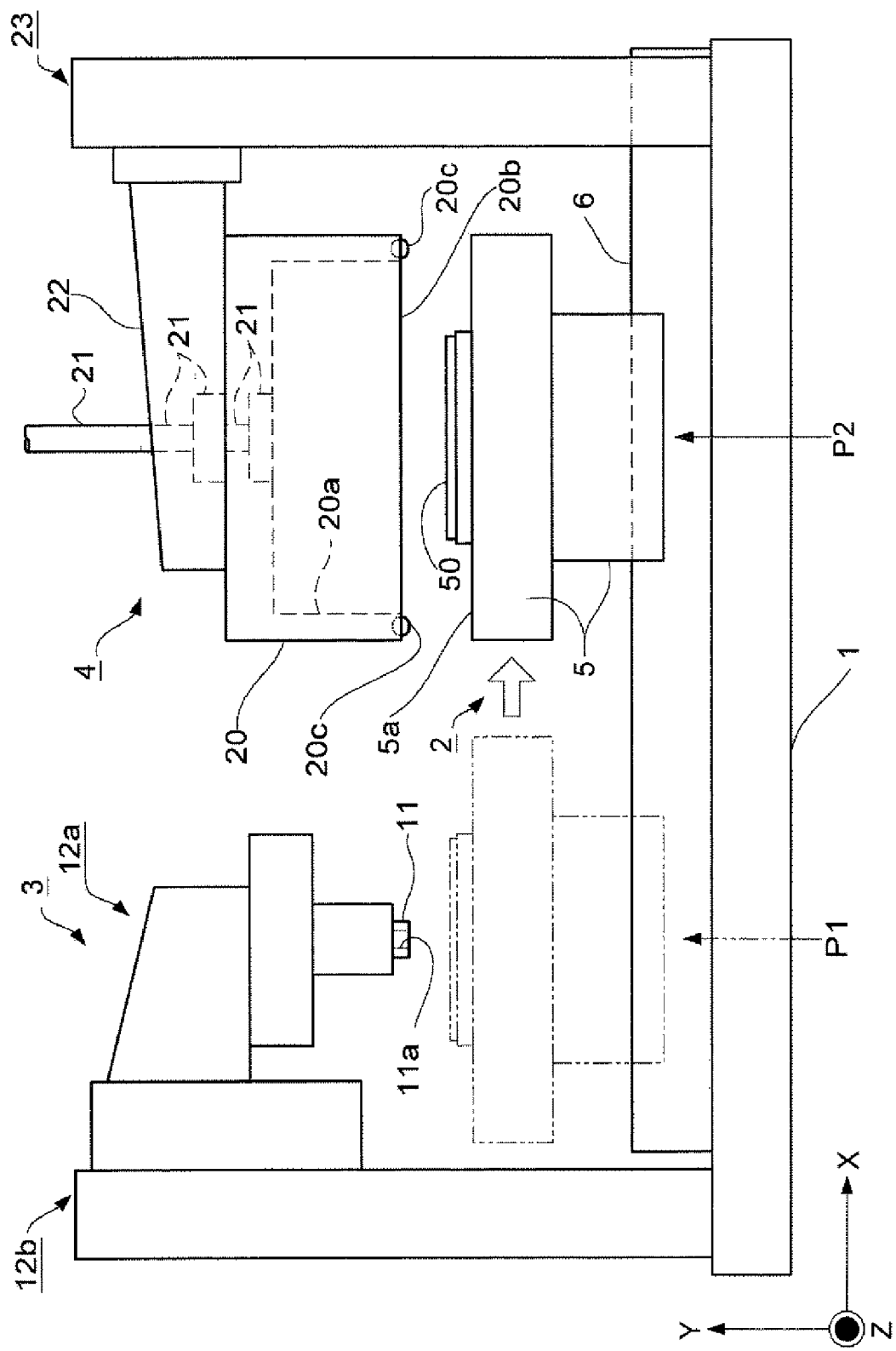
FIG. 3 is a schematic view showing such a state that the board is shifted to a lower side of a drying unit for drying the functional droplet ejected onto the board according to the invention.
Figure 4:
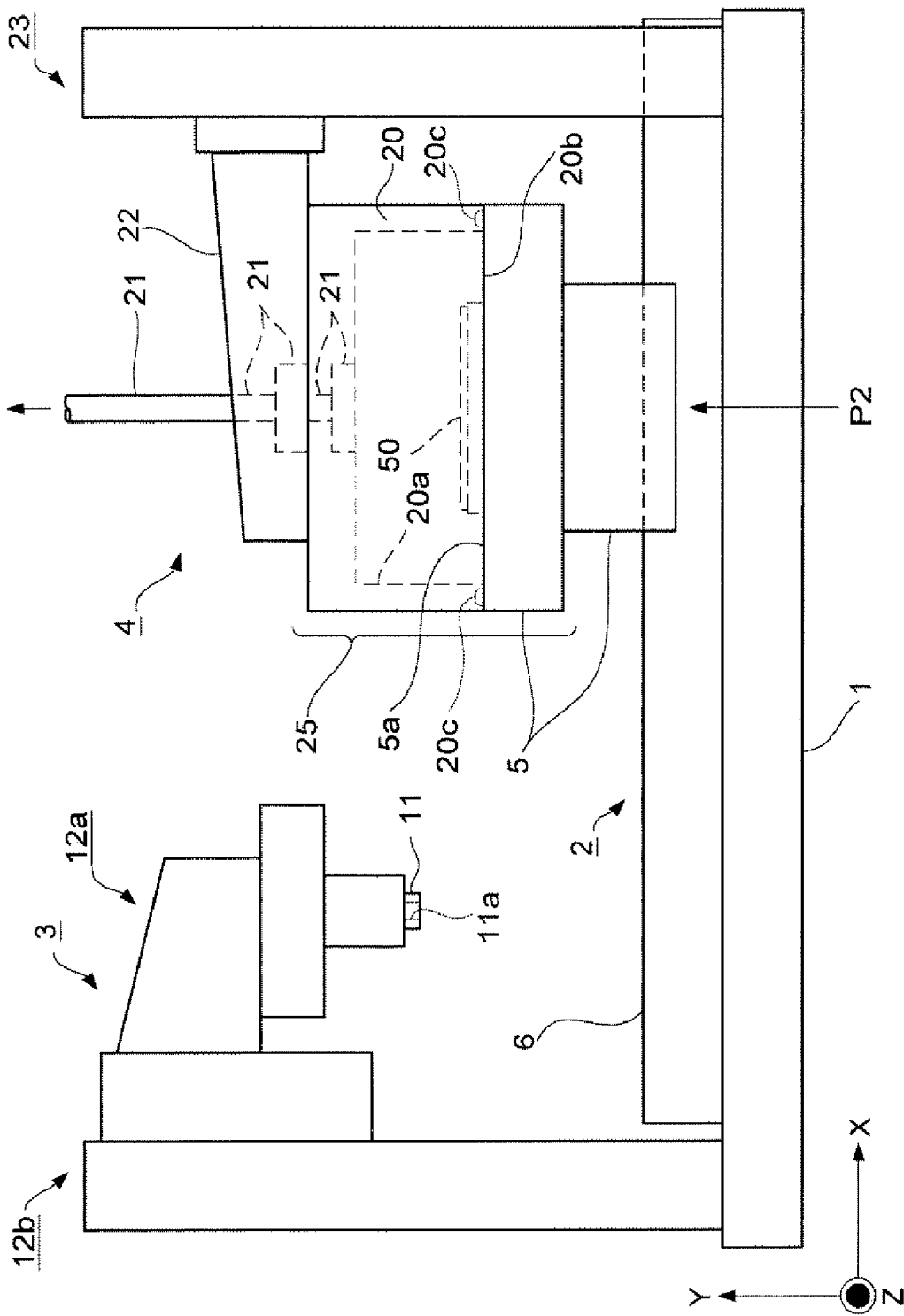
FIG. 4 is a schematic view showing such a state that the board is partially or entirely covered with the drying unit and the functional droplet ejected onto the board is dried.

FIGS. 2, 3, and 4 are schematic views of the functional droplet coating apparatus as an embodiment of the invention.

FIG. 2 is a schematic view showing such a state that the functional droplet is ejected onto the board using the functional droplet coating apparatus according to an embodiment of the invention.

The functional droplet coating apparatus includes a casing 1, a stage unit 2, the drawing unit 3, and the drying unit 4. The stage unit 2 includes the stage 5 on which the board 50 is set and a stage rail 6 capable of shifting or positioning the stage 5, and the stage 5 is shifted to be positioned to the desired position (referred to as a coating position) P1 by a stage controller, not shown, and a stage driver, not shown, for shifting or positioning the stage 5. A stage end surface 5a is defined as a surface used between the stage 5 and the drying unit 2. Details will be described later.

The drawing unit 3 includes the functional droplet discharge head 11 for ejecting the functional droplet 10 onto the board 50, a functional droplet discharge head driver 12a holding the functional droplet discharge head 11, capable of changing a position in an X-axis direction and a Z-axis direction as shown in FIGS. 2, 3, and 4 direction relative to the board 50, a functional droplet discharge head driver 12b holding the functional droplet discharge head driver 12a, capable of changing a position in a Y direction as shown in FIGS. 2, 3, and 4 relative to the board 50, a functional droplet supply pipe, not shown, for supplying the functional droplet discharge head 11 with the functional droplet 10, a tank, not shown, for storing the functional droplets 10, and a functional droplet discharge controller, not shown, for controlling ejection so that the functional droplets 10 of a desired amount are ejected from the functional droplet discharge head 11 to a desired location of the board 50.

The drying unit 4 includes the drying chamber 20 serving as the decompression chamber having a concave portion 20a, a decompression pipe 21 communicating with the drying chamber 20, a decompression pump, not shown, connected to the decompression pipe 21, a drying chamber holder 22 for holding the drying chamber 20 and the decompression pipe 21, a drying chamber driver 23 for shifting or positioning the drying chamber holder 22 in the Y-axis direction as shown in FIGS. 2, 3, and 4, and a drying chamber controller, not shown, for controlling shifting operation or positioning operation of the drying chamber driver 23. Furthermore, a drying chamber end surface 20b of the drying chamber 20 includes a drying chamber gasket 20c serving as an elastic member.

An interrelationship among the casing 1, the stage unit 2, the drawing unit 3, and the drying unit 4 is described next. The stage unit 2, the drawing unit 3, and the drying unit 4 are disposed on the casing 1. The stage 5 included in the stage unit 2 is shifted on the stage rail 6 to be positioned at the predetermined position (referred to as a coating position) P1 with respect to the drawing unit 3 by the stage controller and the stage driver, both not shown.

The functional droplet discharge head driver 12b shifts the functional droplet discharge head 11 and the board 50 in the Y-axis direction shown in FIGS. 2, 3, and 4 to determine a distance therebetween based on ejection conditions such as a viscosity and a surface tension of the functional droplet 10, a size of an opening of a nozzle 11a for ejecting the functional droplet 10, included in the functional discharge head 11, and the like.

The functional droplet discharge head driver 12a can shift in the X-axis direction and the Y-axis direction as shown in FIGS. 2, 3, and 4 and can determine a relative position between the board 50 set on the stage 5 and the functional droplet discharge head 11. The functional droplet discharge controller, not shown, discharges the functional droplet 10 from the functional droplet discharge head 11 in synchronization with shift operation of the functional droplet discharge head driver 12a in the X-axis direction and the Z-axis direction. The functional droplet discharge controller, not shown, stores discharge data on the desired pattern and controls shift operation of the functional droplet discharge head driver 12a in the X-direction and the Z-direction and discharge operation of the functional droplet 10 from the functional droplet discharge head 11 based on the discharge data. Furthermore, in the case of ejection of the functional droplets 10 of plural types, the functional droplet discharge head driver 12b may change a distance between the functional droplet discharge head 11 and the board 50.

Herein, the material for the board 50 is explained herein. A substance of the board 50 may be made from an inorganic substance or an organic substance. Specifically, the board 50 may be made from glass, quartz, a semiconductor substrate, a polyimide film, a cloth, an epoxy resin, a polarizing plate, a color filter substrate, a fluorescent emission board, an EL board, an organic EL board, a liquid crystal panel board, but the invention is not limited to these.

A size of the board 50 is explained herein. There are such large sized displays used for a television that measure approximately 0.5 to 1 millimeter deep by approximately 2 meters wide by approximately 1 meter high.

Next, a material for the functional droplet 10 is explained next. The functional droplet 10 is composed of impalpable particles made from the inorganic substance or the organic substance dispersed in a solvent. To be more precise, the impalpable particle may be a few-nanometer-sized metal such as silver or the like, an organic substance taking on conductive properties upon drying, a substance taking on insulation properties upon drying, a substance taking on optical functions upon drying, and the like. As applicable fields, there are an oriented film substrate such as a liquid crystal panel or the like, a color film substance, an antireflection film, a coating substance, a substance used for painting, a fluorescent substance as a display, a pattern substance having electrically conductive properties, a pattern substance having electrical insulation properties, a display substance relating to food production, and so on.

A method for setting the board 50 on the stage 5 is explained next. There is such a setting method that the board 50 is set on the stage 5 by decompressing a spacing therebetween or that the board 50 is automatically set on the stage 5 by interposing an elastic member therebetween.

In the case where the ejection lapse time after ejection of the functional droplet 10 from the functional droplet discharge head 11 is started reaches the aforementioned blotching prevention time, ejection of the functional droplets 10 from the functional droplet discharge head 11 are suspended. In this case, the ejection is suspended in such a state that the relative position between the board 50 and the stage 5 is maintained.

FIG. 3 is a schematic view showing such a state that the board is shifted to a lower side of the drying unit for drying the functional droplet ejected onto the board.

In FIG. 2, the stage controller and the stage drover, both not shown, starts the shift, i.e., the stage shifting operation of the stage 5 and the board 50 set on the stage 5 from the coating position P1 along the stage rail 6 in such a state that the ejection of the functional droplet 10 from the functional droplet ejection head 11 is suspended.

The stage controller and the stage driver, both not shown, stop the stage 5 where the stage 5 reaches the drying position P2.

FIG. 4 is a schematic view showing such a state that the board is partially or entirely covered with the drying unit and the functional droplet ejected onto the board is dried.

Where the stage 5 reaches the drying position P2 (see FIG. 3) and stops thereat, the drying chamber controller, not shown, included in the drying unit 4 starts the shifting operation of the drying chamber driver 23 in a direction of a bottom side in FIG. 3. In association with this shifting operation, the drying chamber holder 22, the drying chamber 20, and the decompression pipe 21 held by the drying chamber driver 23 are to be shifted.

The shifting operation of the drying chamber driver 23 continues until when the drying chamber end surface 20b of the drying chamber 20 and the stage end surface 5a of the stage 5 come into intimate contact with each other. The drying chamber gasket 20c as the elastic member made from silicon rubber is disposed at the drying chamber end surface 20b to improve intimate contact between the drying chamber end surface 20b and the stage end surface 5a. In this manner, a sealed space (hereinafter referred to as a chamber) 25 is formed between the concave portion 20a of the drying chamber 20 and the stage 5 or the board 50, so that the board 50 is partially or entirely contained in the chamber 25, thereby being in a covered and sealed state. An elevation change corresponding to a thickness of the board 50 exists between the stage 5 and the board 50 but is absorbed by elasticity of the drying chamber gasket 20c.

Next, the decompression pump, not shown, connected to the decompression pipe 21 is operated to reduce pressure in the chamber 25. Therefore, the functional droplet 10 ejected from the functional droplet discharge head 11 onto the board 50 in a coating manner takes on a decompression drying function capable of drying the functional droplet 10 since a boiling point or a vaporization point of the solvent contained in the functional droplet 10 is decreased. In the meanwhile, the functional droplet 10 coating the board 50 may be heated to a firing temperature in order to take on the desired function thereof.

In the case where the functional droplet 10 is dried under the predetermined condition, the drying chamber driver 23 is shifted by the drying chamber controller, not shown, in a direction of an upper side in FIG. 3 after the pressure is restored to atmospheric pressure by suspending the decompression pump, not shown. As a result, the stage 5 and the drying chamber 20 are separated from each other to resolve the chamber 25.

Herein, in the case where the pattern of the functional droplet 10 coating the board 50 is not completed, the stage controller and the stage driver, both not shown, shifts the stage 5 to the coating position P1 again to continue the ejection of the functional droplet 10 onto the board 50 using the drawing unit 3. In the case where the ejection lapse time of the restarted ejection reaches the blotching prevention time again, the aforementioned operation is repeated more than one time at least for execution. The board 50 is removed from the stage 5 where coating of the board 50 with the functional droplet 10 and drying of the functional droplet 10 are completed.

The display manufactured using the functional droplet coating apparatus according to an embodiment of the invention is exemplified as liquid crystal panels, EL displays, organic EL displays, and the like, but the invention is not limited to those and can be widely applied to displays.

The electronic device including the display according to an embodiment of the invention is exemplified as cellular phones, clocks, printers, projectors, color televisions, and the like, but is the invention not limited to those and can be widely applied to electronic devices.

An advantageous effect of an embodiment of the invention is described hereinafter.

First, the "blotching" of the functional droplet 10 on the board 50 can be prevented by rendering the board 50 reciprocate between the drawing unit 3 and the drying unit 4 in a repeating manner more than one time at least while the board 50 is set on the stage 5, in the coating process for ejecting the functional droplet onto the board 50 through the drying process for drying the functional droplet 10 ejected onto the board 50. Second, the "blotching" of the functional droplet 10 on the board 50 can be prevented without reduction in productivity since the operation can be shifted between the coating process and the drying process for a shorter time. Third, the board 50 can be prevented from getting damaged since the operation can be shifted between the coating process and the drying process without removing the board 50 from the stage a.

A modification of the aforementioned embodiment is described hereinafter.

As Modification 1, the board 50 is set on the stage 5 and reciprocates in a repeating manner more than one time at least between the drawing unit 3 and the drying unit 4, but the board 50 is set on the stage 5 and the drawing unit 3 and the drying unit 4 may be shifted by turns over the stage 5 to repeat the coating process and the drying process more than one time at least.

What is claimed is:

1. A functional droplet coating apparatus comprising:
   a functional droplet discharge head for discharging a plurality of functional droplets;
   a stage for setting thereon a board to be coated with the functional droplets discharged from the functional droplet discharge head;
   a drying unit for covering one or entire part of the board set on the stage, the drying unit for drying the functional droplets ejected from the functional droplet discharge head, the drying unit includes a decompression drying function, the drying unit selectively sealingly engaging the board, the drying unit and the board forming a decompression chamber in the drying process;
   a controller determining an elapsed time after the discharging of the functional droplets and comparing the elapsed time to a blotching prevention time, the controller moving the stage and board from the functional droplet discharge head to the drying unit at or before the elapsed time reaches a blotching prevention time.

2. The functional droplet coating apparatus according to claim 1, wherein the functional droplet coating apparatus repeats more than one time at least a coating process for ejecting the functional droplet from the functional droplet discharge head to coat the board set on the stage with the functional droplets and a drying process for covering the one or entire part of the board set on the stage to dry the functional droplets ejected from the functional droplet discharge head onto the board.

3. The functional droplet coating apparatus according to claim 1, wherein the controller further determines whether a pattern of the functional droplets is complete following the stage being moved to the drying unit, if the pattern is not complete, the controller moving the stage and board from the drying unit to the functional droplet discharge head.

* * * * *